United States Patent
Oder

(10) Patent No.: US 9,035,323 B2
(45) Date of Patent: May 19, 2015

(54) SILICON CARBIDE BARRIER DIODE

(71) Applicant: Tom Nelson Oder, Youngstown, OH (US)

(72) Inventor: Tom Nelson Oder, Youngstown, OH (US)

(73) Assignee: Youngstown State University, Youngstown, OH (US)

( * ) Notice: Subject to any disclaimer, the term of this patent is extended or adjusted under 35 U.S.C. 154(b) by 0 days.

(21) Appl. No.: 14/331,515

(22) Filed: Jul. 15, 2014

(65) Prior Publication Data

US 2014/0327017 A1  Nov. 6, 2014

Related U.S. Application Data

(62) Division of application No. 13/121,442, filed as application No. PCT/US2009/039627 on Apr. 6, 2009, now Pat. No. 8,816,356.

(60) Provisional application No. 61/101,180, filed on Sep. 30, 2008.

(51) Int. Cl.
| | |
|---|---|
| H01L 29/15 | (2006.01) |
| H01L 29/16 | (2006.01) |
| H01L 29/47 | (2006.01) |
| H01L 29/66 | (2006.01) |
| H01L 29/72 | (2006.01) |
| H01L 29/872 | (2006.01) |

(52) U.S. Cl.
CPC ............ *H01L 29/1608* (2013.01); *H01L 29/47* (2013.01); *H01L 29/6606* (2013.01); *H01L 29/72* (2013.01); *H01L 29/872* (2013.01)

(58) Field of Classification Search
CPC . H01L 29/1608; H01L 29/47; H01L 29/6606; H01L 29/72; H01L 29/872
USPC .............................................. 257/77; 438/572
See application file for complete search history.

(56) References Cited

U.S. PATENT DOCUMENTS

| | | | |
|---|---|---|---|
| 4,717,681 | A | 1/1988 | Curran |
| 4,758,534 | A | 7/1988 | Derkits, Jr. et al. |
| 4,947,218 | A | 8/1990 | Edmond et al. |
| 5,382,808 | A | 1/1995 | Dreifus et al. |
| 5,516,725 | A | 5/1996 | Chang et al. |
| 5,834,840 | A | 11/1998 | Robbins et al. |
| 6,763,699 | B1 | 7/2004 | Hunter et al. |
| 7,262,434 | B2 | 8/2007 | Okamura et al. |
| 7,268,063 | B1 | 9/2007 | Quick et al. |
| 2004/0256690 | A1* | 12/2004 | Kocon .......................... 257/471 |
| 2005/0133818 | A1* | 6/2005 | Johnson et al. ............... 257/192 |
| 2006/0102920 | A1 | 5/2006 | Song et al. |
| 2006/0236923 | A1 | 10/2006 | Kouvetakis et al. |

OTHER PUBLICATIONS

International Search Report for PCT/US2009/039627 dated Jul. 31, 2009.

\* cited by examiner

*Primary Examiner* — Trung Q Dang
(74) *Attorney, Agent, or Firm* — Fay Sharpe LLP

(57) ABSTRACT

Improved semiconductor devices are fabricated utilizing nickel gallide and refractory borides deposited onto a silicon carbide semiconductor substrate. Varying the deposition and annealing parameters of fabrication can provide a more thermally stable device that has greater barrier height and a low ideality. This improvement in the electrical properties allows use of Schottky barrier diodes in high power and high temperature applications. In one embodiment, a refractory metal boride layer is joined to a surface of a silicon carbide semiconductor substrate. The refractory metal boride layer is deposited on the silicon carbon semiconductor substrate at a temperature greater than 200° C. In another embodiment, a Schottky barrier diode is fabricated via deposition of nickel gallide on a SiC substrate.

20 Claims, 13 Drawing Sheets

SILICON CARBIDE BARRIER DIODE

CROSS REFERENCE TO RELATED APPLICATIONS

The present application is a divisional of U.S. application Ser. No. 13/121,442, having a filing date of Jun. 13, 2011, which is a U.S. national stage filing of PCT Application No. PCT/US2009/039627, claiming the benefit of U.S. Provisional Application Ser. No. 61/101,180, which was filed on Sep. 30, 2008.

STATEMENT REGARDING FEDERALLY SPONSORED RESEARCH OR DEVELOPMENT

This invention was made with United States Government support under Grant No. ECS-0622086 awarded by the National Science Foundation (NSF). The United States Government has certain rights in the invention.

BACKGROUND

The present exemplary embodiment relates to barrier diodes. It finds particular application in conjunction with Schottky diodes fabricated utilizing refractory metal borides and nickel gallide to interface with a silicon carbide semiconductor substrate. This device provides greater barrier height and performance at high temperatures, and will be described with particular reference thereto. However, it is to be appreciated that the present exemplary embodiment is also amenable to other like applications.

Silicon carbide (SiC) has material properties such as a wide band gap, a high thermal conductivity, a high electron saturation velocity, and a high breakdown field. These aspects have made it one of the most promising materials for many high-power and high-temperature electronic device applications. Consequently, a great deal of research effort has been put into the study of this material in the past twenty years, leading to the demonstration of new electronic device structures with remarkable performance. Application areas include wireless technologies for commercial and military needs, high efficiency switches for power distribution, harsh environment sensors, and uses in the automobile industry.

At the present time, one of the major limitations to the full performance of SiC-based devices is related to Schottky and ohmic metal contacts. In particular, Schottky contacts with high a Schottky barrier height (SBH) and a good thermal stability are essential for operations involving high temperature, high gain, and low power consumption. Selection of Schottky contact metals is generally guided by the reaction chemistry at the metal/semiconductor interface and by the Schottky-Mott theory, which predicts the energy barrier $\phi_b$ (barrier height) to the flow of electrons. For this reason, several high work function metals such as Pt, Ni, Au, and Pd have been investigated as Schottky contacts to n-type SiC. Although technological advancement has led to the commercial availability of SiC-based Schottky diodes, their performances still require further improvement especially to ensure reproducibility and reduced reverse bias currents of the devices.

Ni and Ti are the metals most widely used in the fabrication of SiC Schottky diodes. However, Ni/SiC Schottky diodes have been shown to produce non-ideal current-voltage (I-V) characteristics accompanied by dependence of SBH on the surface preparation conditions. Such contacts have been improved by sintering the Ni between 500° C. and 600° C. to form nickel silicide ($N_2Si$). In the process of interfacial solid-state reaction, some SiC material is consumed. However, this process can be undesirable in submicrometer device structures, and Ni/SiC Schottky contacts change to ohmic contact when annealed at ~800° C. for two minutes. The formation of silicides or carbides by several refractory metals (e.g., Co, Ni, Cr, Fe, Pt, Pd, and W), including the interdiffusion of other metals such as Pt and Au noted at temperatures as low as 450° C., is indicative of poor thermal stability, which could eventually lead to the degradation of the Schottky characteristics.

A Schottky barrier diode (SBD), unlike conventional PiN diodes, is a majority carrier device in which the absence of minority carrier storage effects leads to faster switching speeds. In addition, SBDs based on SiC materials have large blocking voltages and can function reliably at higher temperatures. These properties make SiC-based SBDs a primary choice for operations involving high power, high frequency and high temperature (600° C. and above). Although SiC-based SBDs are commercially available, they are rated for operation temperatures below 180° C.

What are needed are systems and methods to improve thermal reliability and electrical properties of Schottky diodes for high power and high temperature applications.

BRIEF DESCRIPTION

In one aspect, a semiconductor device includes a silicon carbide semiconductor substrate, ohmic contact on the back surface and a refractory metal boride layer joined to front surface of the silicon carbide semiconductor substrate. The refractory metal boride layer is deposited on the silicon carbon semiconductor substrate at a temperature greater than 200° C.

In another aspect, a diode comprises a silicon carbide semiconductor substrate and a nickel gallide layer joined to one surface of the silicon carbide semiconductor substrate. The carbide semiconductor substrate is at a temperature greater than 20° C. during deposition.

In yet another aspect, a Schottky diode includes a silicon carbide semiconductor substrate and a nickel gallide layer that is deposited on one surface of the silicon carbide semiconductor substrate at a temperature around 600° C. The diode is annealed subsequent to deposition in a vacuum at around 500° C. for about 24 hours.

DETAILED DESCRIPTION

Schottky barrier diodes using nickel gallide ($Ni_{0.9}Ga_{0.1}$) contacts with SiC (e.g., with n-type 4H—SiC) have enhanced barrier properties. In process subsequent to the deposition, the $Ni_{0.9}Ga_{0.1}$ contacts are annealed in a vacuum and in nitrogen ($N_2$). In one embodiment, the $Ni_{0.9}Ga_{0.1}$ contact is annealed using a rapid thermal processor (RTP). The electrical properties of the diodes are described herein using current-voltage (I-V) and/or capacitance-voltage (C-V) measurements. The physical properties of the contacts are described via Rutherford backscattering spectroscopy (RBS) measurements.

A high average barrier height of 1.78 eV and low average ideality factor of 1.09 can be obtained on diodes annealed in vacuum at 500° C. for twenty-four hours. In addition, a decrease in oxygen at the $Ni_{0.9}Ga_{0.1}$/SiC interface and formation of one or more silicides can occur following vacuum annealing. Improved electrical characteristics of $Ni_{0.9}Ga_{0.1}$/SiC Schottky contacts can be obtained using thermal processing. Such characteristics further device performance of $Ni_{0.9}Ga_{0.1}$ contact metallization in SiC for high power and high temperature applications.

Figure 1A:
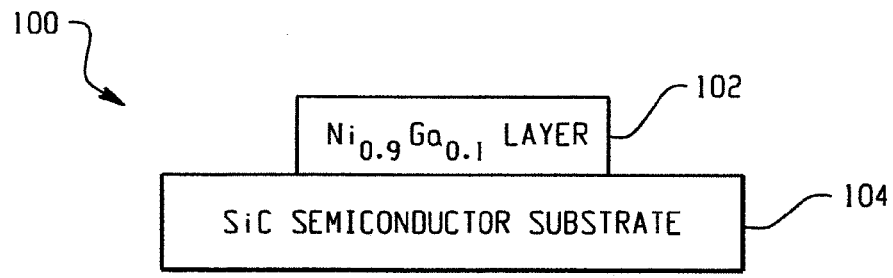
FIGS. 1A and 1B illustrate a diode with a nickel gallide layer and a silicon carbide semiconductor substrate, in accordance with an exemplary embodiment.
Figure 1B:
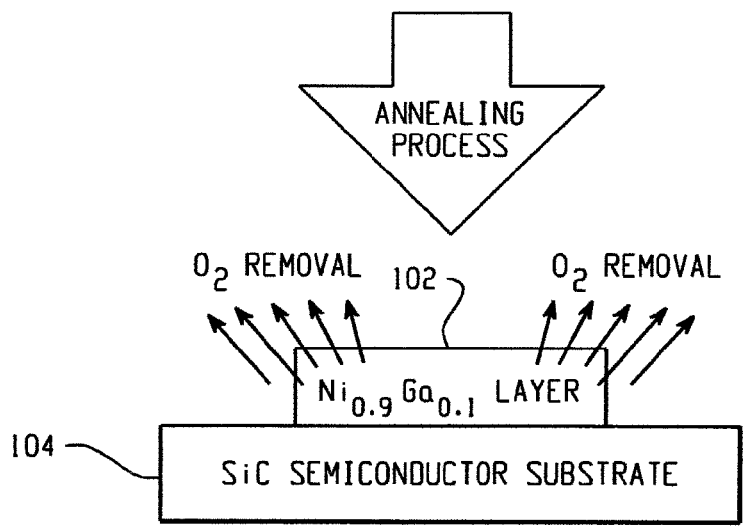

FIGS. 1A and 1B illustrate a device 100 that is fabricated via the deposition of a nickel gallide layer 102 onto a silicon carbide semiconductor substrate 104. In one example, the silicon carbide substrate 104 is an n-type 4H SiC wafer. The nickel gallide layer 102 can be deposited onto the silicon carbide substrate 104 via magnetron sputtering in a vacuum system. In one approach, the vacuum system has a base pressure of $2\times10^{-7}$ Torr. In order to dictate the location of deposit for the nickel gallide layer 102 substantially any process can be employed. In one example, a photolithographic process is employed to define circular patterns onto the silicon carbide substrate 104. In another approach, a shadow mask with circular openings can be employed for the nickel gallide 102 deposition.

Once the nickel gallide layer 102 is deposited on to the silicon carbide substrate 104, the device 100 is annealed. In one example, annealing occurs in a vacuum at approximately 500° C. under a pressure of $5\times10^{-8}$ Torr for approximately 140 hours. In another approach, the device 100 is annealed in a rapid thermal processor under nitrogen ambient from 200° C. to 600° C. for 20 minute at 100° C. intervals.

The nickel gallide 102 can be deposited at around 20° C. or around 600° C. Subsequent annealing for 24-48 hours at around 500° C. can allow the device 100 to exhibit optimum average barrier height levels (e.g. around 1.78 eV) and a low average ideality factor (e.g. around 1.00). Continuing the annealing process beyond a 48 hour time period, however, can reduce the barrier height to approximately 1.60 eV and increases the ideality to approximately 1.30.

In addition, at approximately 24 hours of annealing the device 100 in the vacuum at 500° C., the amount of oxygen at the $Ni_{0.9}Ga_{0.1}$/SiC interface is reduced approximately four times. Such removal of oxygen further provides improved performance for the Schottky diode to be employed in high power and/or high temperature applications since a near homogenous connection is created. In addition to the removal of the oxygen from the interface, a nickel-rich nickel silicide (possibly $Ni_{31}Si_{12}$ which has a large metal work function and lower resistivity) is formed. Both low resistivity and high metal work function contribute to increased Schottky barrier height, to enhance the electrical properties of the contact.

In another approach, refractory metal borides can be employed with a SiC substrate to improve barrier diode performance. Refractory metal borides can address problems of interdiffusion and poor thermal stability for Schottky contacts that interface with n-type 4H—SiC substrates. Refractory metal borides are stoichiometric compounds with narrow composition ranges in contrast to nitrides and carbides. They possess extended networks of covalently bonded boron atoms resulting in very high hardness, very high melting points, excellent chemical resistance, and yet very low electrical resistance. The refractory nature of the borides offers a very attractive advantage as contact metallization for high-temperature device applications.

Figure 2A:
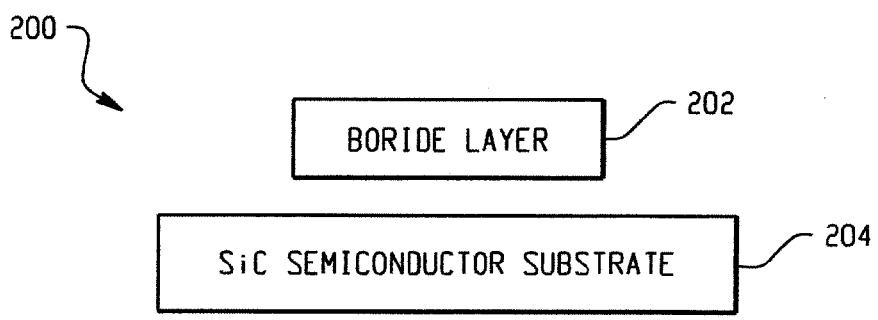
FIGS. 2A, 2B and 2C illustrate a diode with a boride layer and a silicon carbide semiconductor substrate, in accordance with an exemplary embodiment.
Figure 2B:
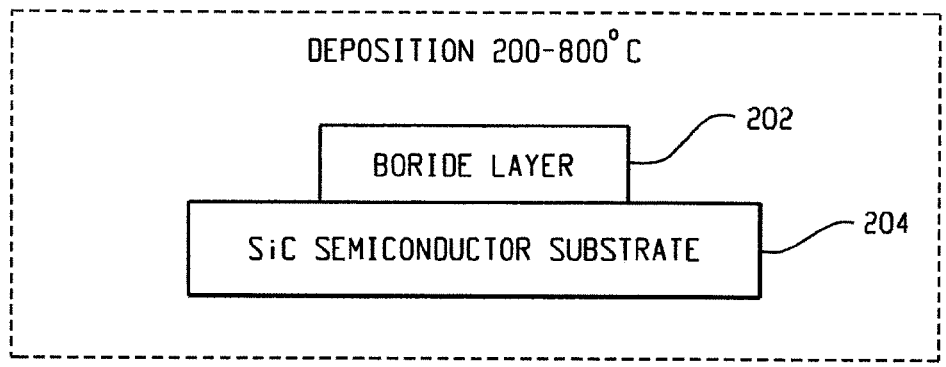
Figure 2C:
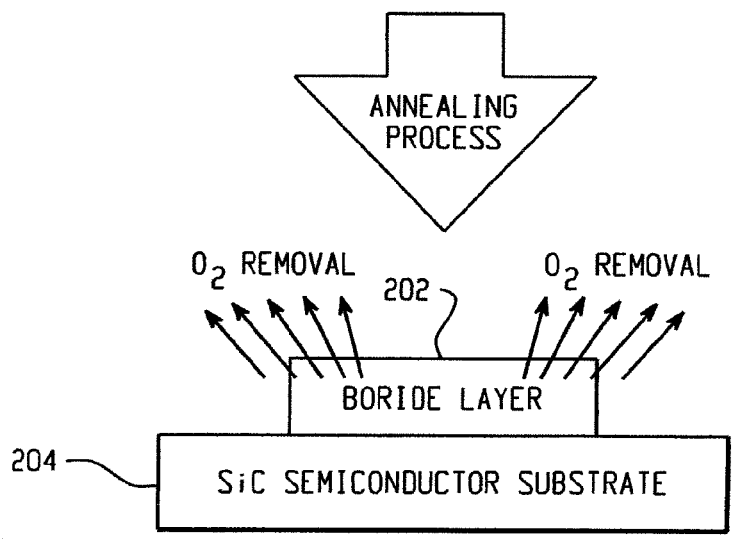

FIGS. 2A, 2B and 2C illustrate a Schottky diode device 200 that is fabricated via a refractory metal boride layer 202 that is deposited onto a silicon carbide semiconductor substrate 204. The boride layer 202 can be substantially any refractory metal boride such as $W_2B$, WB, $W_2B_5$, $ZrB_2$, $TiB_2$, $CrB_2$ and $HfB_2$. The silicon carbide substrate 204 can be an n-type 4H silicon carbide wafer in one embodiment.

FIG. 2B illustrates the deposition of the boride layer 202 on to the silicon carbide substrate 204. This deposition can occur via DC or RF magnetron sputtering in a vacuum system (e.g. with a base pressure of $2\times10^{-7}$ Torr) at a temperature of between 200° C. and 800° C. This deposition can take place via photolithography to provide desired deposition on to the semiconductor substrate 204. In one example, the semiconductor substrate 204 is held at 20° C. or at 600° C. However, in order to achieve an ideality factor around 1.00, deposition at a temperature between 400° C. and 600° C. may be desired.

The Schottky diode 200 is annealed subsequent to the refractory boride layer deposition at around 600° C. for approximately 20 minutes. In one example, the annealing process is performed within a $N_2$ environment utilizing a rapid thermal processor. The ideality factor and barrier height of the device 200 remain relatively unchanged through the high temperature annealing process indicating excellent thermal stability of the device 200.

In addition, the annealing process removes oxygen at the interface between the boride layer 202 and the semiconductor substrate 204 to leave an intimate and homogenous metal semiconductor contact. Accordingly, the Schottky diode 200 fabrication can be employed for fabrication of substantially any high temperature/high power and high frequency electronic device. Some examples include Schottky barrier diodes, detectors, transistors, and thyristors with enhanced electrical, optical, physical and thermal performance. It is to be appreciated that substantially any pure elemental metal, metallic alloy, metal boride, metal silicide, metal carbide, and/or metal nitride is contemplated in place of a refractory metal boride for the boride layer 202. Additionally, it is contemplated that the silicon carbide semiconductor substrate 204 can utilize disparate materials such as Group III-nitrides, ZnO, etc. in place of the silicon carbide.

Figure 3:
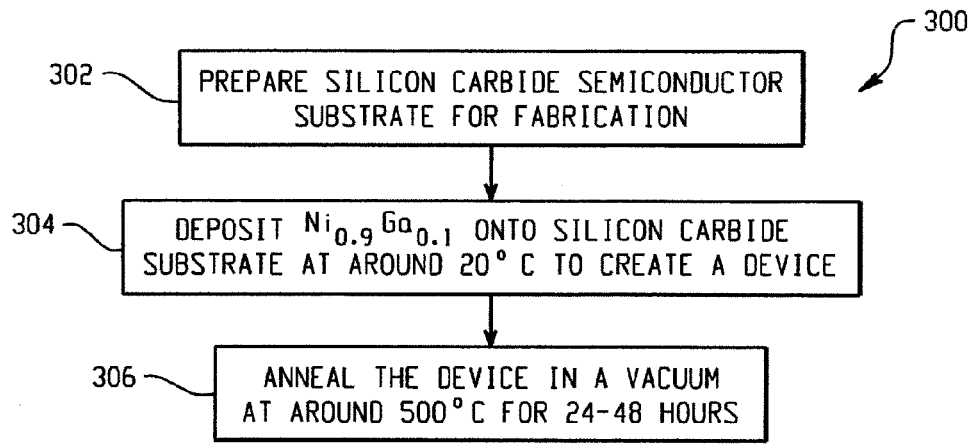
FIG. 3 illustrates a method for fabrication of a diode, in accordance with an exemplary embodiment.

FIG. 3 illustrates a methodology 300 to fabricate a Schottky diode. At reference numeral 302, a silicon carbide semiconductor substrate is prepared for fabrication. In one example, the semiconductor substrate can include a silicon carbide material that consists of a 4.6 µm-thick n-type epilayer ($N_d$ approximately $1 \times 10^{16}$ cm$^{-3}$) that is grown 8° off the basal plane of a 400 µm thick n-type substrate. A 30 nanometer thick sacrificial layer of $SiO_2$ can be grown at approximately 1,150° C. and stripped with buffered hydrofluoric acid followed by a rinse in de-ionized water.

At 304, nickel gallide is deposited onto the silicon carbide substrate at around 20° C. Such deposition can be performed by DC or RF magnetron sputtering in a vacuum system (e.g. with a base pressure of $2 \times 10^{-7}$ Torr). A photolithographic or mask process can be utilized to facilitate deposition of the nickel gallide on to the silicon carbide semiconductor substrate. The Schottky diode is annealed at 306 in a vacuum at around 500° C. for approximately 24-48 hours. This deposition and annealing process can provide a barrier height of approximately 1.80 eV and an ideality factor of approximately 1.00.

Figure 4:
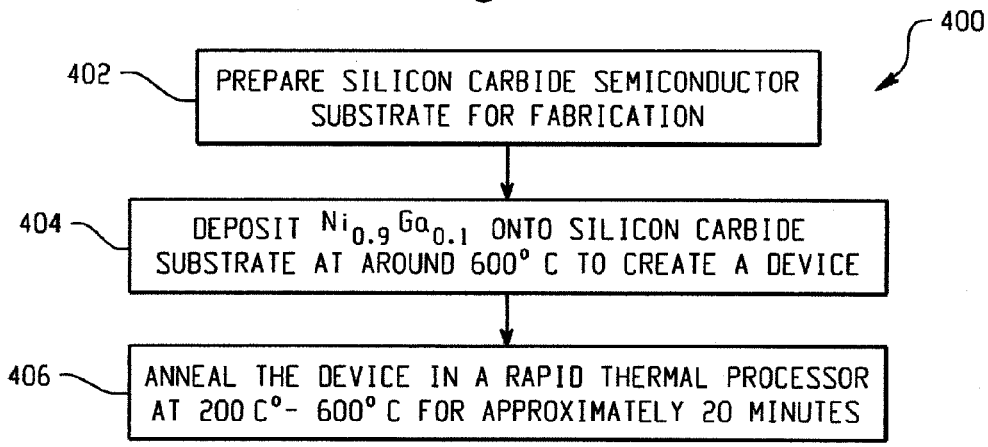
FIG. 4 illustrates a method for fabrication of a diode, in accordance with an exemplary embodiment.

FIG. 4 illustrates a method 400 to fabricate a Schottky diode. At 402 a silicon carbide semiconductor substrate is prepared for fabrication. At 404, nickel gallide is deposited on to the silicon carbide substrate at around 20° C. Such deposition can be performed by DC or RF magnetron sputtering in a vacuum system (e.g. with a base pressure of $2 \times 10^{-7}$ Torr). A photolithographic or mask process can be utilized to facilitate deposition of the nickel gallide on to the silicon carbide semiconductor substrate. At reference numeral 404, nickel gallide is deposited on to the silicon carbide substrate at around 600° C. At 406, the device is annealed in a rapid thermal processor at between 200° C. and 600° C. for approximately 20 minutes. The Schottky diode is annealed in a vacuum at around 500° C. for approximately 24-48 hours. This deposition and annealing process can provide a barrier height of approximately 1.80 eV and an ideality factor of approximately 1.00.

Figure 5:
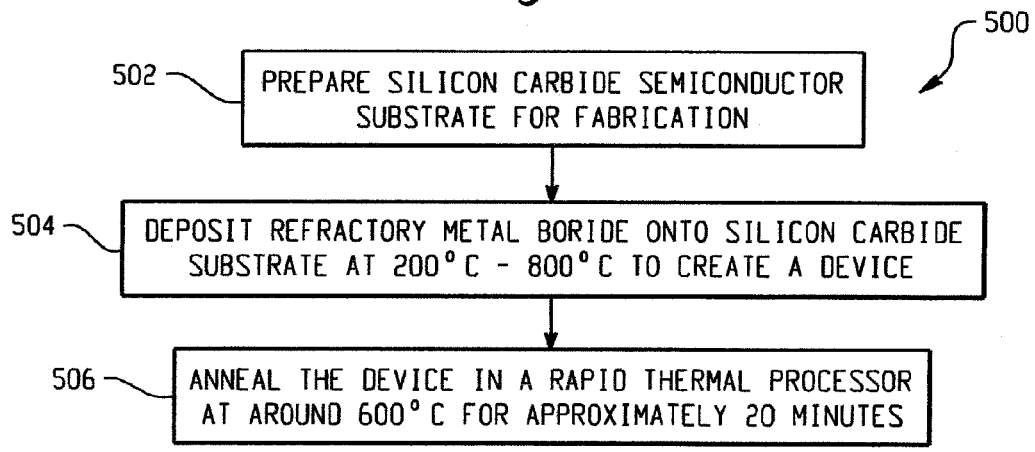
FIG. 5 illustrates a method for fabrication of a diode, in accordance with an exemplary embodiment.

FIG. 5 illustrates a method 500 to fabricate a Schottky diode. At reference numeral 502, a silicon carbide semiconductor substrate is prepared for fabrication. In one example, the semiconductor substrate can include a silicon carbide material that consists of a 4.6 µm-thick n-type epilayer ($N_d$ approximately $1 \times 10^{16}$ cm$^{-3}$) that is grown on a 400 µm thick n-type substrate cut at 8° off the basal plane. A 30 nanometer thick sacrificial layer of $SiO_2$ can be grown at approximately 1,150° C. and stripped with buffered hydrofluoric acid followed by a rinse in de-ionized water.

At 504, a refractory metal boride is deposited on to the silicon carbide substrate at 200° C. to 800° C. to create a device. In one approach, the silicon carbide substrate is thermally desorbed by heating at 600° C. in vacuum for 30-60 minutes prior to deposition of the refractory metal boride. The refractory metal boride can be substituted for one of more of a pure elemental metal, a metal alloy, a metal boride, a metal silicide, a metal carbide, and a metal nitride. Deposition of the metal boride can be facilitated via magnetron sputtering utilizing a pure sputter gas such as argon, for example. The refractory metal boride can be one or more of a $ZrB_2$, WB, $W_2B_5$, $W_2B$, $TiB_2$, $CrB_2$ and $HfB_2$. The borides can be deposited through a shadow mask with array of holes of diameter 0.5 mm placed on the SiC. Alternatively, the borides can be blanket-deposited on the heated SiC, followed by photolithographic patterning and the unwanted boride films removed by etching in appropriate acid ($HCl:HNO_3=3:1$). In addition, the semiconductor substrate can be an n-type 4H silicon carbide material.

At 506, the device is annealed in pure $N_2$ using a rapid thermal processor at around 600° C. for approximately 20 minutes. In one example, the ideality of the device is around 1.00 with a barrier height between 0.94 eV and 1.15 eV. The ideality and barrier height values do not change throughout the annealing process, even though it occurs at high temperatures to indicate excellent thermal stability of the diodes fabricated. The deposition at high temperature provides removal of oxygen from the interface between the refractory metal boride and the silicon carbide substrate to provide a more homogeneous and intimate contact. The thermal stability of this contact is suitable for devices to be used in high power, high temperature and high frequency applications.

Initially, a SiC (e.g., n-type 4H—SiC) wafer is diced into squares (e.g., 5 mm×5 mm). Three disparate samples A, B, C are cleaned in boiling acetone, isopropyl alcohol and rinsed in de-ionized water. A 30-nm thick sacrificial layer of $SiO_2$ is grown at 1,150° C., and later stripped with buffered hydrofluoric acid followed by a rinse in de-ionized water. Nickel gallide metal contacts are deposited (e.g., via DC or RF magnetron sputtering) in a vacuum system with a base pressure of around $2 \times 10^{-7}$ Torr. The Ar gas used for the deposition is maintained at a pressure of 2 mTorr, a flow rate of 20 standard cubic centimeters per minute (sccm) and a plasma current of 50-100 mA. The nickel gallide films are sputter-deposited from a target of $Ni_{0.9}Ga_{0.1}$. The back-side ohmic contact is formed by depositing Ti (25 nm)/$Ni_{0.9}Ga_{0.1}$ (65 nm)/Ti (10 nm) followed by annealing in a flowing nitrogen atmosphere at 950° C. for 2 minutes using a rapid thermal processor (RTP).

Figure 8:
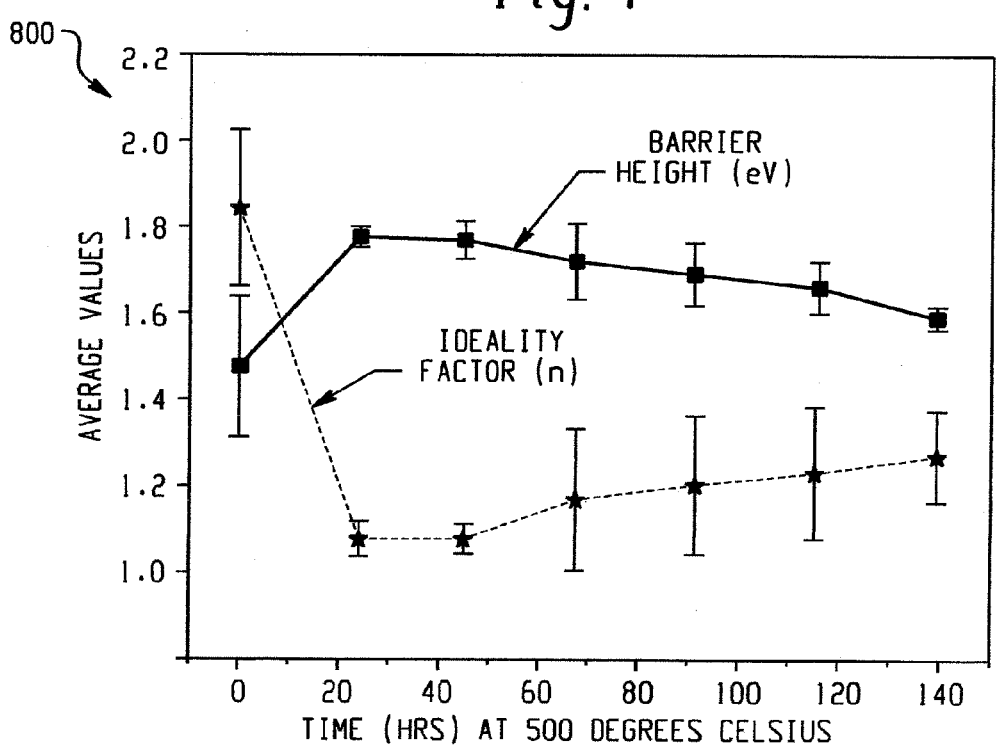
FIG. 8 is a plot of barrier height and ideality factor relative to annealing time of $Ni_{0.9}Ga_{0.1}/SiC$ Schottky diode, in accordance with an exemplary embodiment.

On a first sample (sample A), as illustrated in plot 800 in FIG. 8, the photolithographic process is used to define circular patterns. The patterned sample is immersed in an HF solution for 30s space to strip away residual oxide layers on the surface, followed by a rinse in de-ionized water and blow-drying. The samples are then loaded in a deposition chamber. About 180 nm-thick $Ni_{0.9}Ga_{0.1}$ film is deposited at room temperature (~20° C.) after an overnight pumpdown. The resulting Schottky contacts are circular with diameters varying from 140-200 µm. The $Ni_{0.9}Ga_{0.1}$ Schottky contacts on the samples B and C, illustrated in plots 900 and 1000 in FIGS. 8 and 9 respectively, are deposited through a shadow mask with circular openings of diameters 500 µm, at 20° C. (sample B) and at 600° C. (sample C).

In one embodiment, the I-V measurements of the Schottky diodes are performed using a Keithley 2400 Sourcemeter and the C-V measurements are performed using Keithley 590/595 CV system. Post-deposition annealing is performed on sample A in vacuum at 500° C. under a pressure of 5×10$^{-8}$ Torr for a total of 140 hours. Samples B and C are annealed in the rapid thermal processor under N$_2$ ambient from 200° C. to 600° C. for 20 min each time. Two separate samples for RBS analyses are prepared by depositing the Ni$_{0.9}$Ga$_{0.1}$ films on unpatterned SiC materials under identical conditions as described above.

Figure 6:
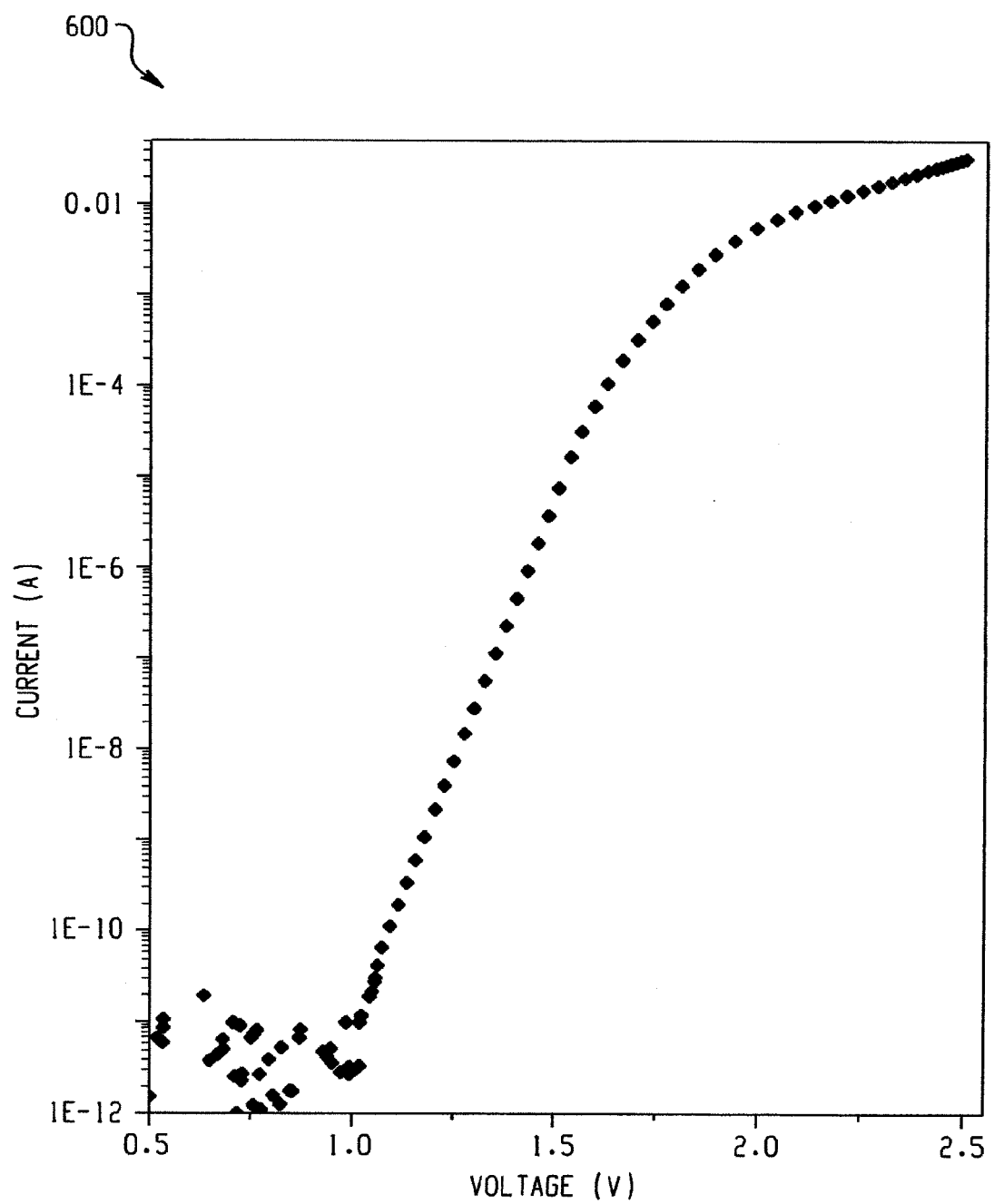
FIG. 6 is a semi-logarithmic I-V plot of data from diodes of sample A ($Ni_{0.9}Ga_{0.1}/SiC$), in accordance with an exemplary embodiment.
Figure 7:
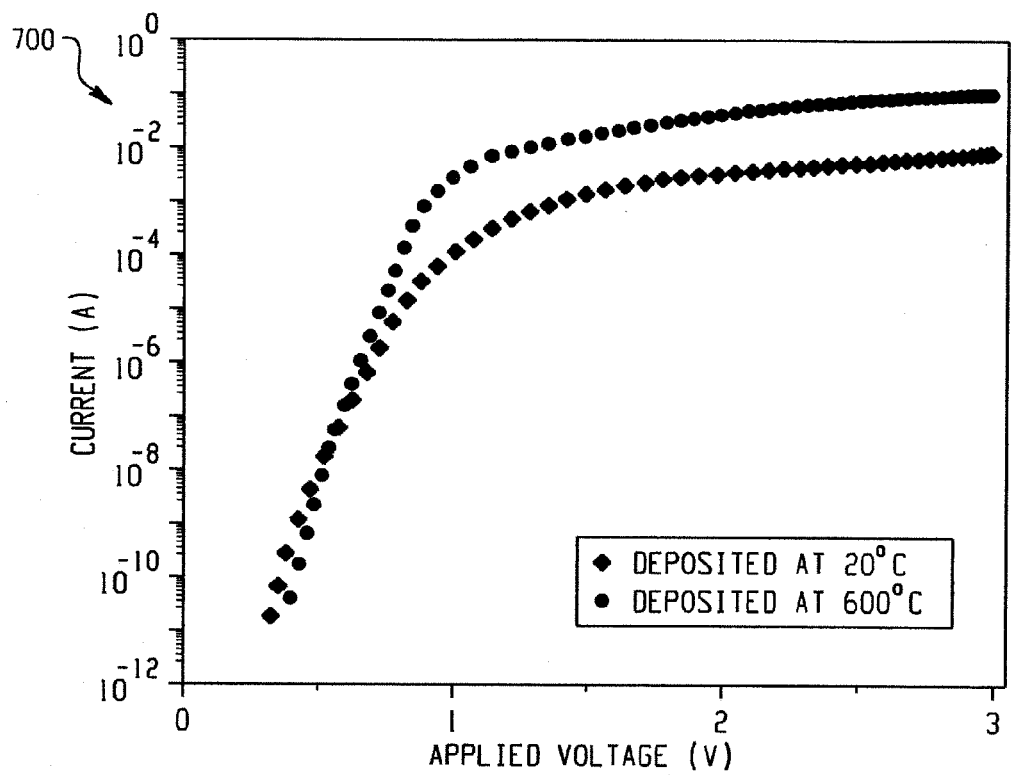
FIG. 7 is a semi-logarithmic I-V plot of data from tungsten boride (WB) contacts, in accordance with an exemplary embodiment.

FIG. 6 shows a typical semilogarithmic plot 600 of the I-V data from the diodes annealed in vacuum at 500° C. for 24 hours. The forward biased I-V data is analyzed using standard thermionic emission theory for electron transport from a metal to a semiconductor with low doping concentration. The current flow (I) is given by the relation:

$$I = AA^*T^2 \exp\left(\frac{-q\Phi_b}{kT}\right)\left[\exp\left(\frac{q(V-IR)}{nkT}\right)-1\right] \quad (1)$$

where A is the area of the Schottky contact, A* is the effective Richardson constant (146 Acm$^{-2}$K$^{-2}$), $\Phi_b$ is the zero bias Schottky barrier height (SBH), R is the series resistance and n is the ideality factor. From this expression, if, 3kT/q<<V<<IR, the plot of ln(I) versus the applied voltage (V) gives a straight line, from which the value of n and $\phi_b$ can be determined.

Figure 9:
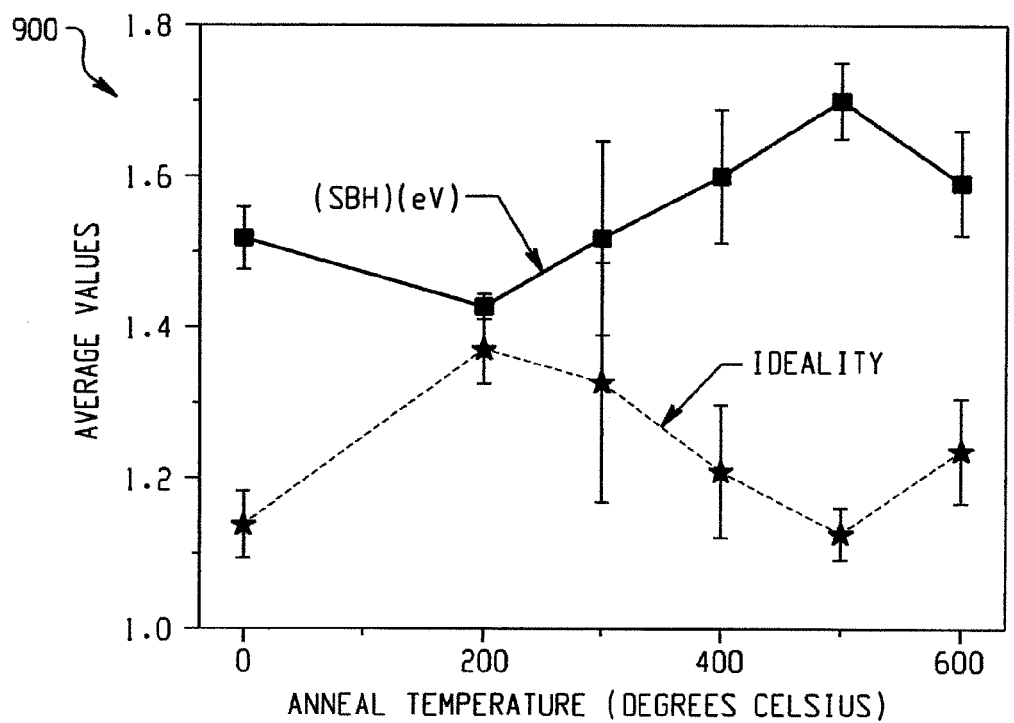
FIG. 9 is a Schottky barrier height and ideality for a $Ni_{0.9}Ga_{0.1}$/SiC Schottky diode relative to annealing temperature, in accordance with an exemplary embodiment.
Figure 10:
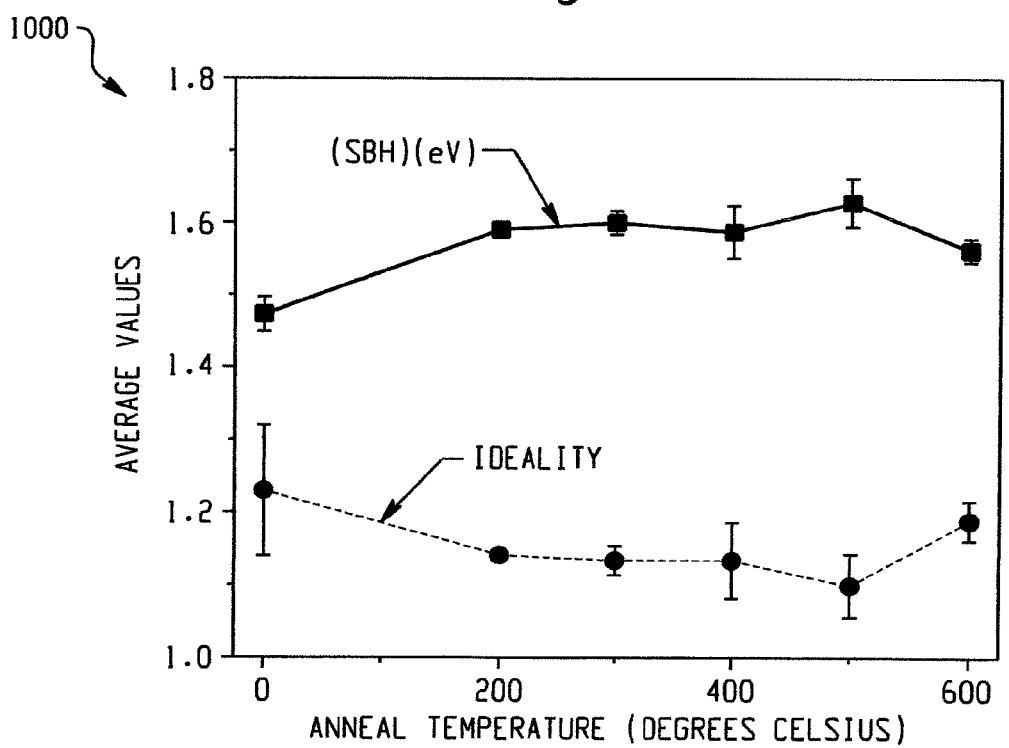
FIG. 10 is a Schottky barrier height and ideality for a $Ni_{0.9}Ga_{0.1}$/SiC Schottky diode relative to annealing temperature, in accordance with an exemplary embodiment.

The values of n and $\Phi_b$ obtained for the three samples A, B and C are plotted in FIGS. 8, 9 and 10, respectively. These values are average values obtained from at least five diodes. The data shown in FIG. 8 for sample A with the Ni$_{0.9}$Ga$_{0.1}$ Schottky contact deposited at 20° C. and subsequently annealed in vacuum shows optimum average barrier height of 1.78 eV and average ideality factor of 1.09 after annealing for 24-48 hours. These values can change to $\Phi_b$=1.66 eV and n=1.29 with further annealing performed up to 140 hrs.

The data plotted in FIGS. 9 and 10 from I-V measurements on samples B and C annealed in RTP, indicate optimum barrier properties is obtained after annealing at 500° C. for both samples. For sample B with the Ni$_{0.9}$Ga$_{0.1}$ Schottky contact deposited at 20° C., the optimum values are $\Phi_b$=1.70 eV and n=1.12, while for sample C with the Ni$_{0.9}$Ga$_{0.1}$ contact deposited at 600° C., the corresponding optimum values are $\Phi_b$=1.63 eV and n=1.10.

Each data point in the plots shown in FIGS. 8, 9 and 10 is obtained by averaging values obtained from five diodes from sample A to minimize any reading variation. This variation can arise from lateral inhomogeneities at the metal/semiconductor interface resulting in a lowering of the SBH that correlates with an increase in the ideality factor. The SBH of a laterally homogeneous metal/semiconductor contact can be obtained by plotting the SBH as a function of the ideality factor and extrapolating this plot to n=1.

Figure 11:
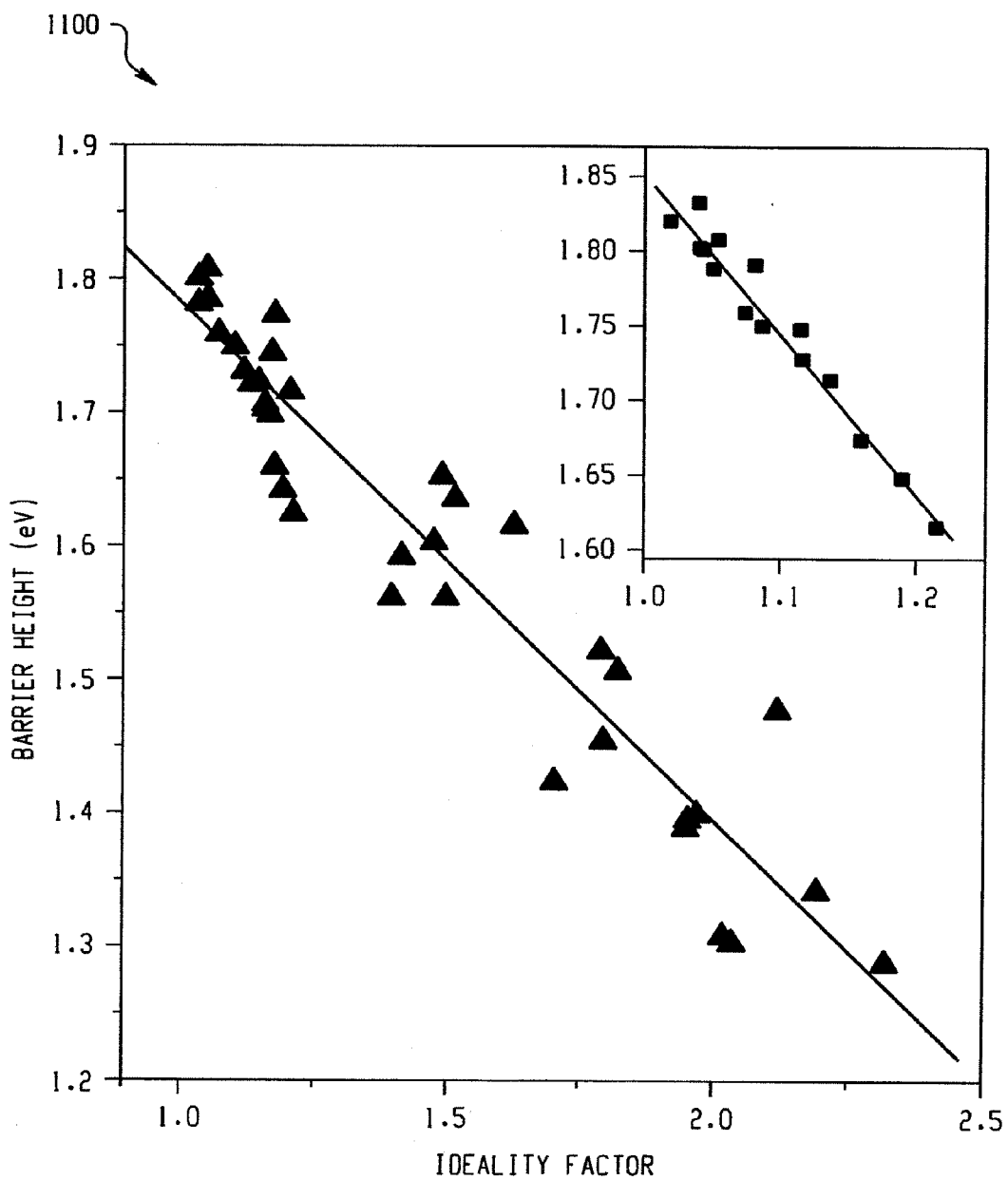
FIG. 11 is a plot of barrier height versus ideality for I-V measurements of a $Ni_{0.9}Ga_{0.1}$/SiC Schottky diode, in accordance with an exemplary embodiment.

FIG. 11 shows a plot 1100 of the SBH as a function of the ideality factor from I-V measurements on sample A and the extrapolated value of 1.85 eV is obtained representing the predicted value of the SBH for a laterally homogeneous Ni$_{0.9}$Ga$_{0.1}$/SiC contact. The inset shows a similar plot for values of n less than 1.2. It is to be appreciated that similarly estimated values for samples B and C have an SBH of 1.80 eV and 1.72 eV, respectively.

Diodes in disparate embodiments are annealed in vacuum at 500° C. for 24 hours, wherein both I-V and C-V measurements are performed. The average SBH from I-V measurements for these embodiments is 1.75 eV and n=1.11, similar to the values obtained from sample A. The C-V measurements are performed by superposing a small alternating voltage of 10 mV at 1 MHz on the reverse dc bias and the resulting data analyzed using the relation $$\frac{C}{A} = \sqrt{\frac{q\varepsilon_s|N_D - N_A|}{2(V_{bi} + |V| - KT/q)}} \quad (2)$$

which can be rewritten as $$\left(\frac{A}{C}\right)^2 = \frac{2(V_{bi} - kT/q)}{q\varepsilon_s N_D} + \frac{2|V|}{q\varepsilon_s N_D} \quad (3)$$

where A is the area of the Schottky contact, V$_{bi}$ is the built-in potential, $\varepsilon_S$ is the semiconductor dielectric constant (9.66 for 4H—SiC), N$_D$ is the doping concentration of the semiconductor and kT is the thermal energy. By plotting (A/C)$^2$ versus the reverse biased voltage V, a straight line graph is obtained whose slope is 2/q$\varepsilon_S$N$_D$. The intercept on the V-axis is V$_i$=–V$_{bi}$+kT/q. From the relation of the SBH and the built-in potential, we obtain $$\Phi_b = V_i + \frac{kT}{q}\left[1 + \ln\left(\frac{N_o}{N_D}\right)\right] \quad (4)$$

The value N$_o$=1.69×10$^{19}$ cm$^{-3}$ can be used for the effective density of state for 4H—SiC.

Figure 12:
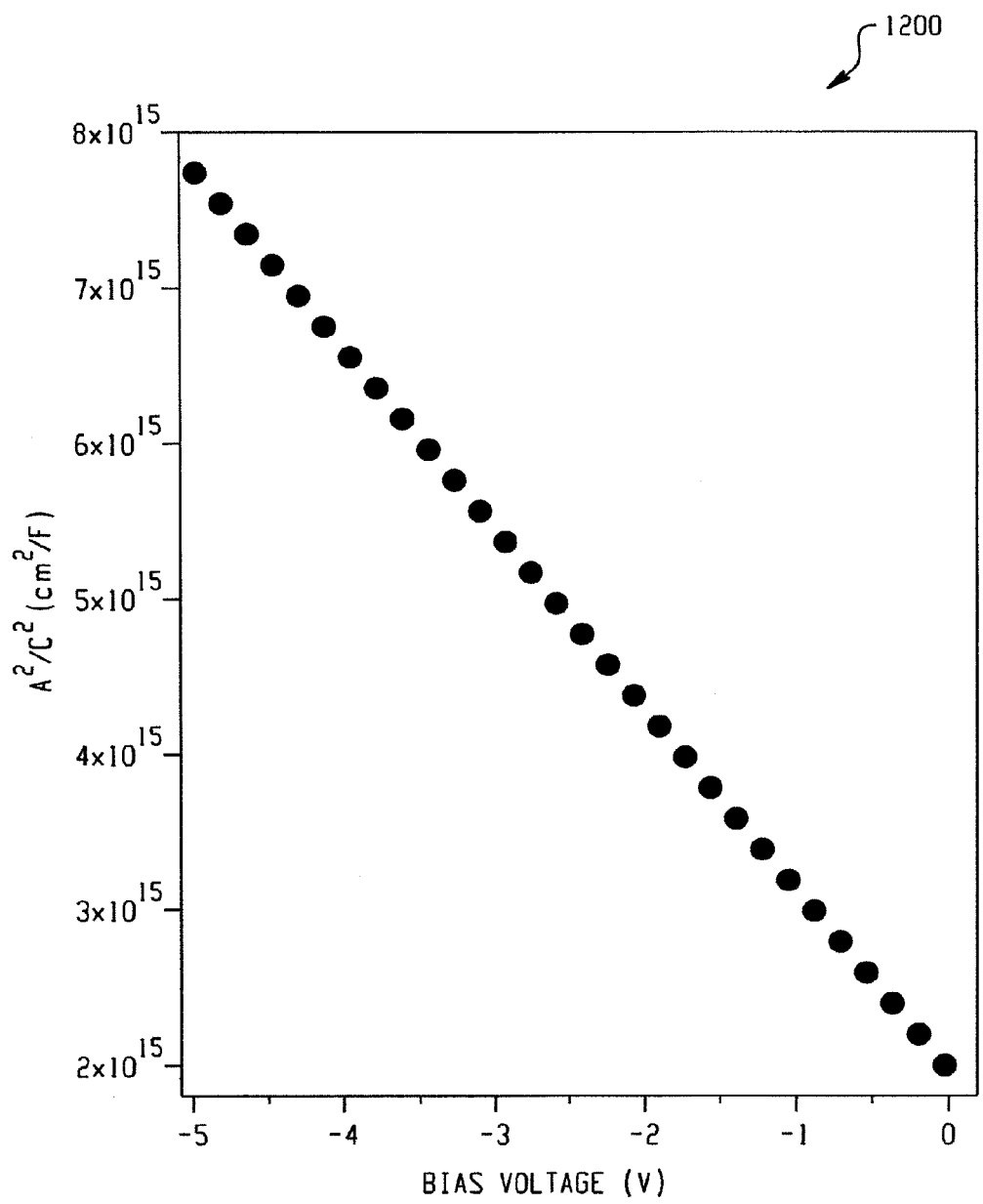
FIG. 12 is a plot of $A^2/C^2$ versus bias voltage for a $Ni_{0.9}Ga_{0.1}$/SiC diode, in accordance with an exemplary embodiment.

A plot 1200 shows (A/C)$^2$ versus V for a diode is shown in FIG. 12. The average value of N$_D$ obtained from these plots is 9.9×10$^{15}$ cm$^{-3}$, which is close to 1×10$^{16}$ cm$^{-3}$ manufacturer specified value for these samples. The average value of the SBH obtained is 2.26 eV, which is larger than the value of 1.75 eV obtained from the I-V measurements. This difference in the values of the SBH can be a result of factors such as the presence of a thin oxide layer at the Ni$_{0.9}$Ga$_{0.1}$/SiC interface and image force lowering which affects the data obtained from the I-V measurements.

The values of the series resistance R of the diodes are extracted from the relation $$I = I_0 \exp\left[\frac{q(V-IR)}{nkT}\right] \quad (5)$$

Differentiating this equation with respect to I gives $$I = \frac{1}{R}\left(\frac{dV}{d\ln(I)}\right) - \left(\frac{kT}{q}\right)\left(\frac{n}{R}\right) \quad (6)$$

Figure 13:
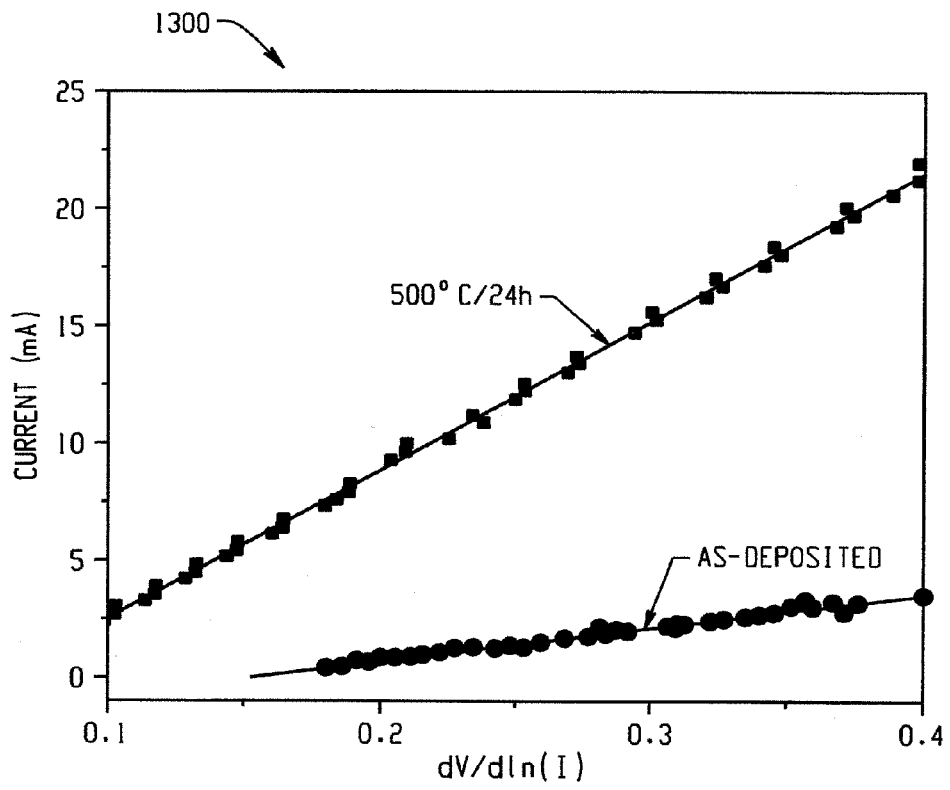
FIG. 13 is a plot of current vs. dV/dIn for $Ni_{0.9}Ga_{0.1}$/SiC Schottky diodes before and after annealing in a vacuum for 24 hours in at 500° C., in accordance with an exemplary embodiment.

The series resistance is then obtained from the reciprocal of the slope of the graph of I plotted against dV/dln(I). FIG. 13 shows such plots 1300 from sample A before (as-deposited) and after annealing in vacuum for 24 hrs at 500° C., from which R=16Ω, which is much smaller than the value of R=70Ω obtained from the as-deposited contacts. The reduction in the series resistance with annealing was similarly observed to occur in samples B and C that were annealed using RTP in N$_2$ environment.

Figure 14:
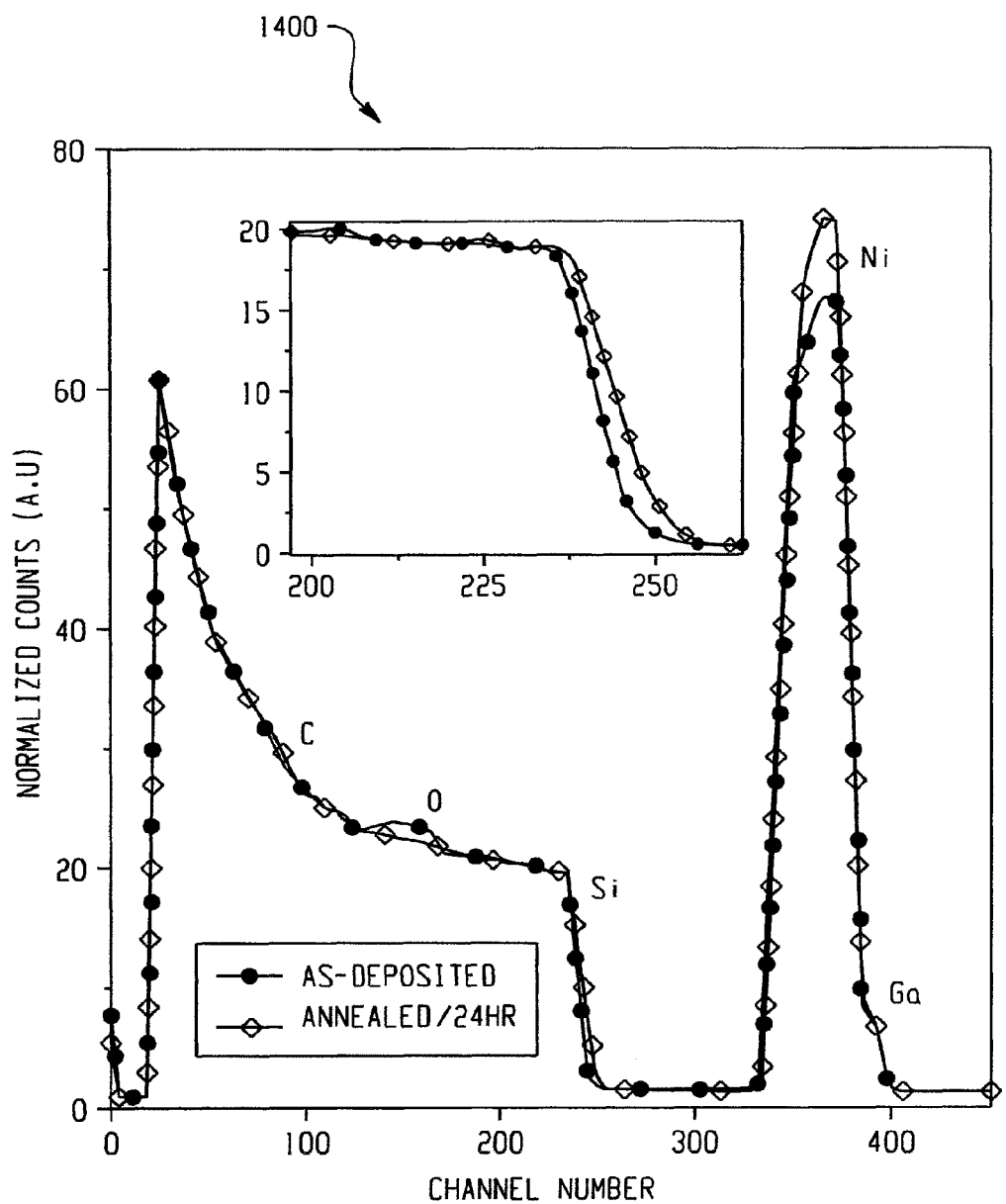
FIG. 14 shows plots of RBS analysis of a $Ni_{0.9}Ga_{0.1}$/SiC contact deposited at 20° C., in accordance with an exemplary embodiment.

The results 1400 from the physical analysis of the Ni$_{0.9}$Ga$_{0.1}$/SiC contact deposited at 20° C. performed using RBS are presented in FIG. 14 which shows the spectra for the as-deposited film and one annealed in vacuum at 500° C. for 24 hours. These plots indicate that the amount of oxygen present in the as-deposited contact is significantly reduced after the 24-hour annealing. In addition, the thickness of the $Ni_{0.9}Ga_{0.1}$ film following the annealing is reduced from 185 nm to 135 nm, with a Ni:Si proportion of about 29:1. The reduction in the oxygen content in the contact can occur in the form of volatile oxides especially at 500° C. The decrease in the thickness of the Ni signal from 185 nm to 135 nm and the presence of Si shows that an interaction takes place between the Ni and Si to form a silicide at the interface.

The high ratio of Ni:Si deduced from the RBS spectra facilitates formation of a Ni-rich silicide. For Ni/Si Schottky contacts, a Gaussian distribution of Schottky barrier height changes with the annealing temperature. This variation in barrier height correlates with formation of different nickel silicides. A maximum barrier height can be obtained at annealing temperature of 550° C.-600° C. For the Ni/SiC contact, as the annealing temperature is increased from 500° C. and above, nickel-rich silicides (such as $Ni_{31}Si_{12}$) form prior to conversion to a more stable $Ni_2Si$. A Ni-rich silicide can form at the Ni/SiC, which is responsible for the optimum barrier properties achieved after annealing at 500° C.

The improvement obtained for the $Ni_{0.9}Ga_{0.1}$/SiC Schottky barrier diodes can be related to one or more factors. During vacuum annealing at 500° C. for 24-44 hrs, oxygen escapes out of the contact (e.g., via a volatile oxide), leaving the annealed contact with less oxygen and a lower resistivity. In the as-deposited film, Ni has not reacted with SiC, but with the annealing at 500° C., Ni diffuses outward and reacts with SiC to form a nickel silicide phase (possibly $Ni_{31}Si_{12}$) of lower resistivity. The observed decrease in series resistance following the annealing is thus explained in terms of the escape of oxygen and the formation of nickel silicides(s), whose resistivity is known to be smaller than that of Ni. Furthermore, the work function of $Ni_{31}Si_{12}$ is reported to be larger than that of Ni by as much as 0.36 eV.

In addition, the out-diffusion of Si leaves silicon vacancies ($V_{Si}$) which act as acceptors in 4H—SiC. The observed increase in the SBH can be due to the formation of a nickel-rich silicide (e.g. $Ni_{31}Si_{12}$) which has a large work function, while the contribution of $V_{Si}$ at the interface may be minimal. Further annealing at 500° C. beyond the 44 hours can lead to formation of other nickel silicides phases (e.g. $Ni_2Si$ or NiSi), accompanied by out-diffusion of C, which leaves donor-like carbon vacancies ($V_C$) at the interface. The combined effect of this is the slight decrease in the SBH beyond the 44 hours annealing as set forth in FIGS. 8-10 herein.

In order to provide thermal stability and device homogeneity, boride contacts can be employed with a Schottky diode. In particular, refractory metal borides: WB, $W_2B$, $W_2B_5$$ZrB_2$, $TiB_2$, $CrB_2$ and $HfB_2$ can be used as Schottky contact metals to fabricate the Schottky barrier diodes on silicon carbide (SiC). In one embodiment, n-type 4H—SiC wafers (e.g., 5 mm×5 mm squares) consist of a 4.6 µm-thick n-type epilayer ($N_d$~$1\times10^{16}$ $cm^{-3}$) grown 8° off the basal plane of a 400 µm-thick n-type substrate of resistivity 0.019 Ω-cm. The samples are cleaned in boiling acetone, isopropyl alcohol and rinsed in de-ionized water. A 30-nm thick sacrificial layer of $SiO_2$ is grown at 1,150° C., and stripped with buffered hydrofluoric acid followed by a rinse in de-ionized water.

The metal contacts can be deposited by (e.g., DC or RF magnetron sputtering) in a vacuum system with a base pressure of approximately $2\times10^{-7}$ Torr. The Ar gas used for the deposition is maintained at a pressure of around 2m Torr, a flow rate of about 20 standard cubic centimeters per minute (sccm) and a plasma current of 50-100 mA. The backside ohmic contact can be formed by depositing Ti (25 nm)/ $Ni_{0.9}Ga_{0.1}$(65 nm)/Ti (10 nm) followed by annealing in a flowing nitrogen atmosphere at 950° C. for two minutes using a rapid thermal processor (RTP).

Figure 15:
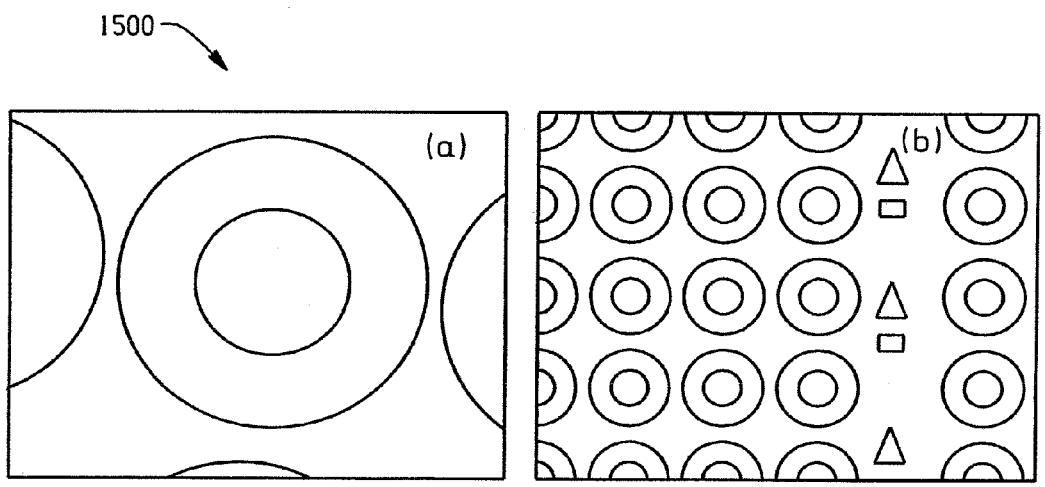
FIG. 15 is an optical microscope image of boride/SiC diodes, accordance with an exemplary embodiment.

Before depositing the Schottky contacts, the samples are boiled in acetone, alcohol and rinsed in de-ionized water. While protecting the back ohmic contact by gluing the samples on a Si wafer, the samples are dipped in dilute HF for approximately three minutes, rinsed in de-ionized water and dried. Each metal boride contact ($W_2B$, WB and $W_2B_5$, $ZrB_2$, $TiB_2$, $CrB_2$ and $HfB_2$) is deposited on two unpatterned substrates, one held at 20° C. and the other at 600° C. to provide comparison between the resulting diodes. Circular patterns are defined using photolithographic process (resulting in circular Schottky contacts with diameters varying from 140-200 µm). The unwanted metal boride is etched in a mixture of three parts HCl to one part $HNO_3$. FIGS. 15(a) and (b) show the optical microscope images 1500 of the boride Schottky barrier diodes at different magnification looking from the top.

Figure 16:
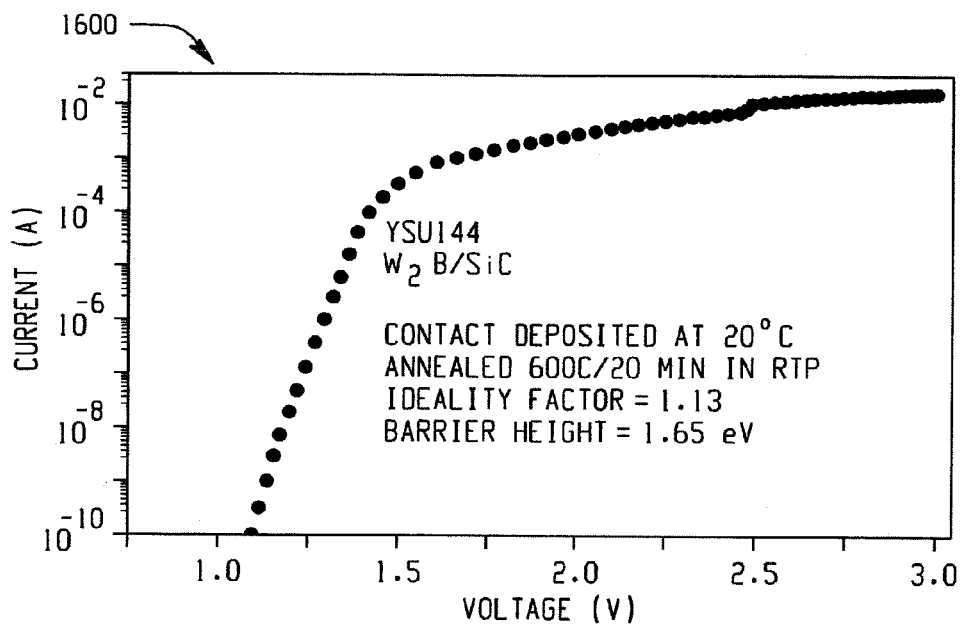
FIG. 16 is an I-V plot of a $W_2B$/SiC Schottky barrier diode, in accordance with an exemplary embodiment.

The electrical characterization of the diodes to identify I-V measurements is obtained before and after a 600° C./20 min annealing in $N_2$ environment using an RTP. FIG. 16 shows a typical I-V plot 1600 of the $W_2B$/SiC diode deposited at 20° C. and then annealed at 600° C./20 min in a $N_2$ ambient using an RTP. The plot 1600 shows an ideality factor of 1.13 and SBH of 1.65 eV is obtained. The average value of $N_D$ obtained from these plots was $9.9\times10^{15}$ $cm^{-3}$, which is close to $1\times10^{16}$ $cm^{-3}$, the manufacturer specified value for these samples. The average value of the SBH obtained for all samples is 2.26 eV, which is larger than the value of 1.75 eV obtained from the I-V measurements. This difference in the values of the SBH can be caused by the presence of a thin oxide layer at the $Ni_{0.9}Ga_{0.1}$/SiC interface and image force lowering which affects the data obtained from the I-V measurements.

The forward biased I-V data is analyzed using the standard thermionic emission relation for electron transport from a metal to a semiconductor with low doping concentration as embodied in equation (1), paragraph [0049]. The values of the series resistance R of the diodes were extracted from the relation of equations (5) and (6) in paragraph [0056]. In one embodiment the values of the series resistance of the boride contacts is 12 ohms for those deposited at 600° C.

Figure 17:
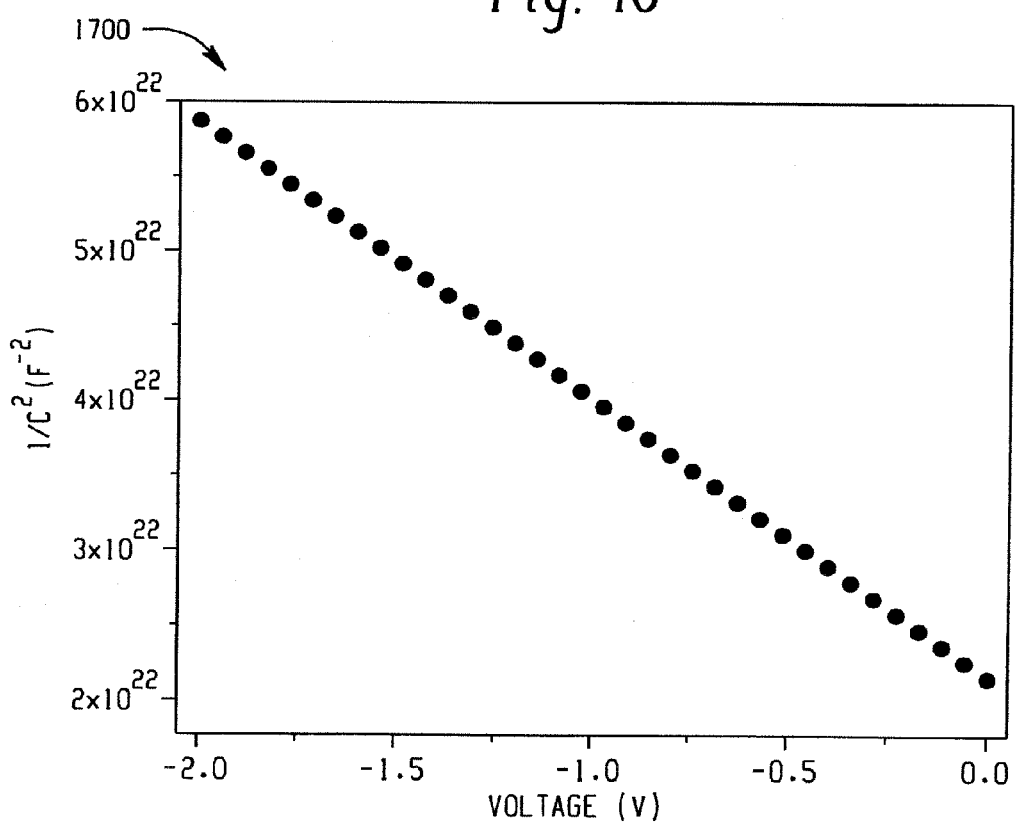
FIG. 17 is a plot showing $(1/C)^2$ versus voltage for a $W_2B$/SiC diode, in accordance with an exemplary embodiment.

The C-V measurements are performed by superposing a small alternating voltage of 10 mV at 1 MHz on the reverse dc bias and the resulting data analyzed using the relation in equations (2), (3) and (4) of paragraph [0054]. FIG. 17 shows a typical plot 1700 of $(1/C)^2$ versus V for a diode. Table 1 below shows the values of the ideality factor (n) and the barrier heights obtained using the I-V and C-V measurements. These results are average values obtained from measurements taken on at least five diodes. Values outside the brackets are for as deposited boride contacts and those inside the brackets are obtained after the diodes were annealed in $N_2$ using RTP at 600° C./20 min.

TABLE 1

Table I: The values of the ideality factor (n) and the barrier heights obtained using the I-V and C-V measurements. Values outside the brackets are for as deposited boride contacts and those inside the brackets are obtained after the diodes were annealed in $N_2$ using RTP at 600° C./20 min.

| Contact | Substrate Temp (° C.) | Ideality Factor | SBH (eV) using IV | SBH (eV) using CV |
|---|---|---|---|---|
| $W_2B_5$ | 20 | 1.28(1.17) | 1.20(1.28) | 1.44(1.55) |
| | 600 | 1.09(1.11) | 1.11(1.08) | 1.35(1.35) |

TABLE 1-continued

Table I: The values of the ideality factor (n) and the barrier heights obtained using the I-V and C-V measurements. Values outside the brackets are for as deposited boride contacts and those inside the brackets are obtained after the diodes were annealed in $N_2$ using RTP at 600° C./20 min.

| Contact | Substrate Temp (° C.) | Ideality Factor | SBH (eV) using IV | SBH (eV) using CV |
|---|---|---|---|---|
| WB | 20 | N/G(1.31) | N/G(1.15) | N/G(1.55) |
| | 600 | 1.07(1.06) | 1.15(1.16) | 1.54(1.42) |
| $W_2B$ | 20 | N/G(1.20) | N/G(1.57) | N/G(1.83) |
| | 600 | 1.05(1.04) | 1.03(1.02) | 1.28(1.20) |
| $HfB_2$ | 20 | 1.12(1.10) | 1.01(0.94) | N/G(1.22) |
| | 600 | 1.07(1.09) | 1.10(1.08) | N/G(1.32) |
| $CrB_2$ | 20 | 1.67(1.25) | 1.03(1.00) | 1.27(1.18) |
| | 600 | 1.17(1.20) | 1.02(1.09) | 1.26(1.30) |
| $TiB_2$ | 20 | 4.80(1.34) | 0.87(0.90) | 1.12(1.34) |
| | 600 | 1.10(1.11) | 0.94(0.92) | 1.19(N/G) |

N/G = Data not good enough for determination of these values.

From these values, an average value of the SBH as high as 1.57 with a corresponding ideality factor of 1.2 from I-V measurements is obtained using the borides as the Schottky contact. In many of the boride diodes, deposition at elevated temperature (600° C.) yields ideality factor as small as 1.04 and I-V barrier height in the range 0.94 eV-1.14 eV. In contrast, contacts deposited at 20° C. show an ideality factor equal to around 1.2. Accordingly, deposition at higher temperature results in Schottky barrier diodes with superior electrical quality than those with the contacts deposited at 20° C.

Figure 18:
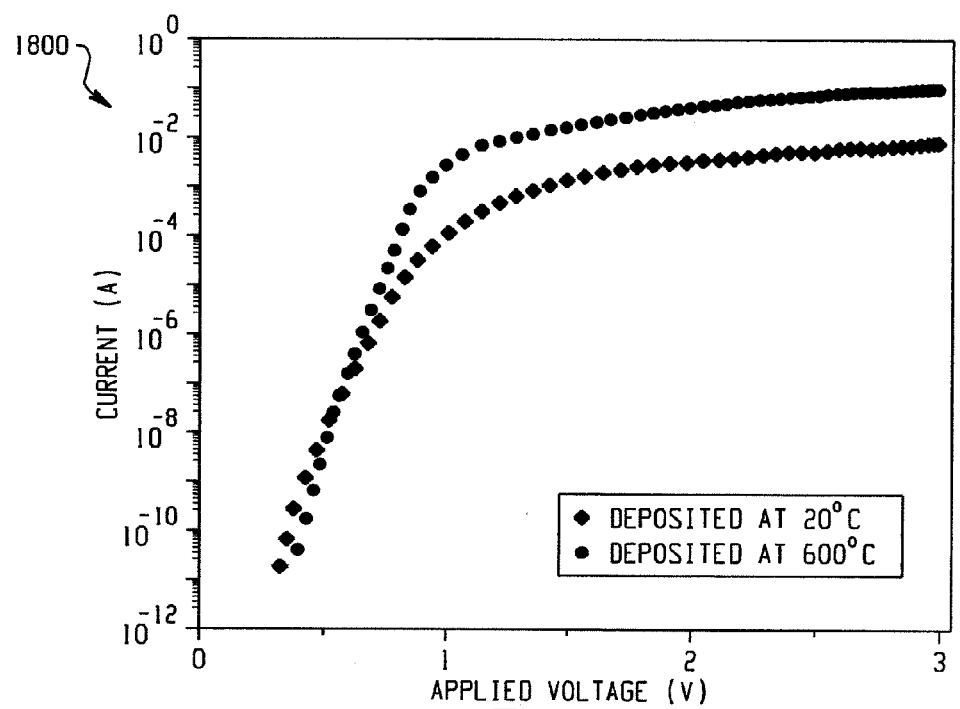
FIG. 18 is an I-V plot of diodes with a WB contact deposited at 20° C. and 600° C., in accordance with an exemplary embodiment.
Figure 19:
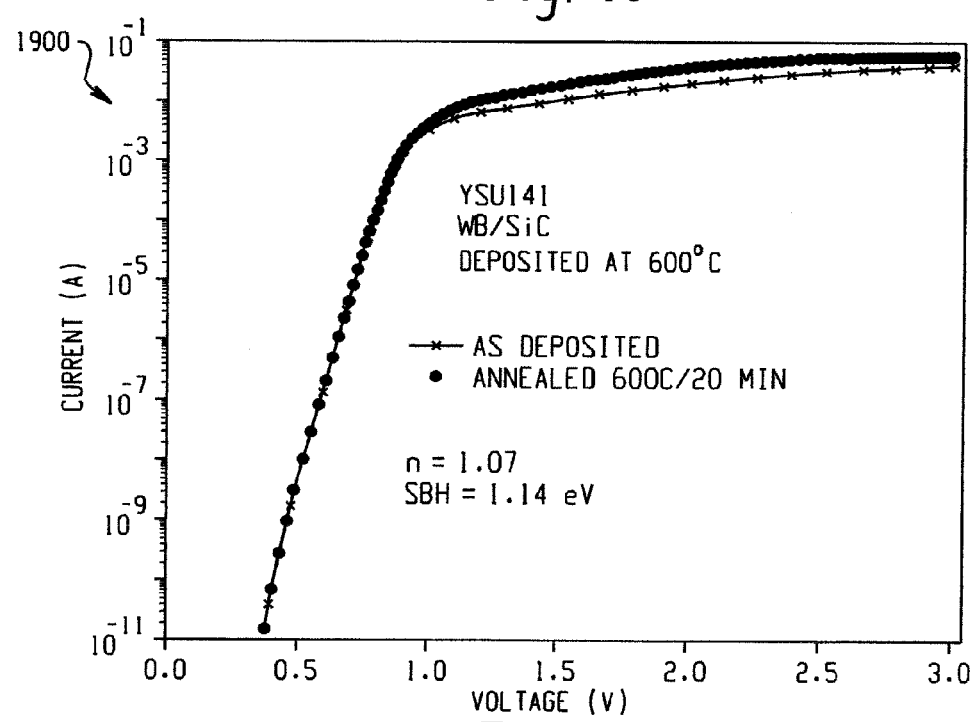
FIG. 19 is an I-V plot of diodes with a WB contact deposited at 600° C., before and after annealing, in accordance with an exemplary embodiment.

FIG. 18 shows an I-V plot 1800 to compare diodes with the WB contacts deposited at 20° C. (shorter linear portion) and at 600° C. (with a longer linear portion). The diodes with contacts deposited at 600° C. provide values of ideality factor and SBH that virtually remain unchanged after annealing at 600° C./20 min using an RTP, as further shown in the plots 1900 of FIG. 19. This indicates excellent thermal stability of these diodes. The diodes deposited at 20° C. show improved electrical qualities after annealing in the RTP. The surface morphologies of these diodes after annealing at 600° C./20 min does not show any roughness as seen in an optical microscope at 1000× magnification. The $ZrB_2$/SiC previously analyzed shows a maximum barrier height of 1.09 eV. The borides show better electrical results such as barrier heights as high as 1.57 eV on average.

Figure 20:
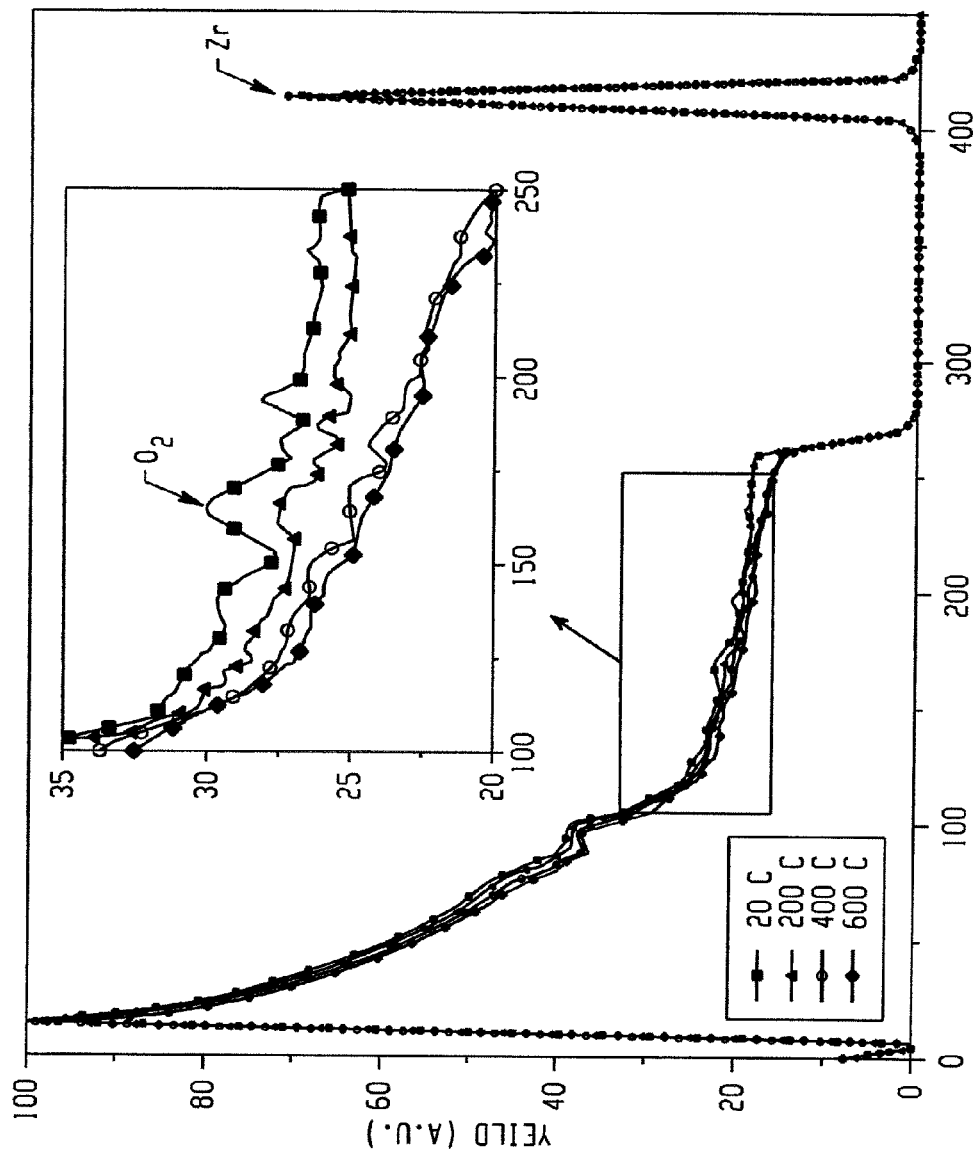
FIG. 20 illustrates RBS spectra of $Zr_2B$/SiC films deposited between 200° C.-600° C., in accordance with an exemplary embodiment.

FIG. 20 illustrates RBS spectra of $Zr_2B$/SiC films deposited between 200° C.-600° C., in accordance with an exemplary embodiment. To further study the physical properties of the boride/SiC films with the alteration of the substrate temperature during deposition, several unpatterned SiC samples were prepared. $ZrB_2$ films were deposited on each sample at different temperatures of 20° C., 200° C., 400° C. and 600° C. The samples were then analyzed using Rutherford backscattering spectroscopy, and the RBS spectra from these films are shown in FIG. 20. From the simulation of these spectra, the Zr:B:$O_2$ ratios at these deposition temperatures are 1:2:1 at 20° C.; 1:2:0.4 at 200° C.; and 1:2:0 at 400° C. and 600° C. This implies that deposition at 400° C. and above results in little or no oxygen in the boride/SiC films.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A diode, comprising:
   a silicon carbide semiconductor substrate; and
   a nickel gallide layer joined to one surface of the silicon carbide semiconductor substrate via deposition;
   wherein the carbide semiconductor substrate at a temperature greater than 20° C. during deposition.

2. A diode as in claim 1 wherein the diode is annealed after deposition in at least one of a vacuum and a nitrogen ($N_2$) environment.

3. A diode as in claim 1 wherein the Schottky barrier height of the diode is at least 1.70 eV.

4. A diode as in claim 1 wherein the ideality factor of the diode is around 1.00.

5. A diode as in claim 1 wherein the diode is annealed after deposition at 500° C. for between 24 and 48 hours.

6. A diode as in claim 1 wherein the nickel gallide layer is deposited on the silicon carbide semiconductor substrate at a temperature around 600° C.

7. A Schottky diode, comprising:
   a silicon carbide semiconductor substrate; and
   a nickel gallide layer that is deposited on one surface of the silicon carbide semiconductor substrate at a temperature around 600° C.;
   wherein the diode is annealed subsequent to deposition in a vacuum at around 500° C. for about 24 hours.

8. The diode according to claim 1, wherein the molar ratio of nickel to gallide in the nickel gallide layer is 9:1.

9. A diode as in claim 1, wherein a Schottky barrier height of the diode is approximately 1.80 eV.

10. A diode as in claim 1, wherein the Shottky barrier height of the diode is greater than 1.60 eV.

11. A diode as in claim 1, wherein the ideality factor of the diode is lower than 1.30.

12. A diode as in claim 1, wherein the Schottky barrier height of the diode is approximately 1.80 eV and the ideality factor of the diode is around 1.0.

13. A diode as in claim 7, wherein the Schottky barrier height of the diode is approximately 1.80 eV and the ideality factor of the diode is around 1.0.

14. A method for forming a Schotty diode, comprising:
   preparing a silicon carbide semiconductor substrate for fabrication;
   depositing a nickel gallide onto the silicon carbide substrate to create the diode; and
   annealing the diode.

15. The method as in claim 14, wherein the depositing the nickel gallide is performed at around 20° C. by either DC or RF magnetron sputtering in a vacuum system.

16. The method as in claim 14, wherein the depositing the nickel gallide is performed at around 600° C.

17. The method as in claim 14, wherein the annealing is performed in a vaccum at around 500° C. for approximately 24-48 hours.

18. The method as in claim 14, wherein the annealing is performed in a rapid thermal processor at between 200° C. and 600° C. for approximately 20 minutes.

19. The method as in claim 14, wherein the annealing is performed in $N_2$ using a rapid thermal processor at around 600° C. for approximately 20 minutes.

20. The method as in claim 14, wherein the preparing a silicon carbide semiconductor substrate for fabrication includes growing a n-type epilayer on a n-type substrate cut at an angle off a basal plane.

* * * * *